Feb. 8, 1966 A. LEDERMAN ET AL 3,234,463

HIGH-FREQUENCY MEASURING APPARATUS INCLUDING SEMIMETAL THERMOELECTRIC JUNCTION MEANS

Filed Aug. 25, 1961

INVENTORS
ALBERT LEDERMAN
JOHN H. GREIG

United States Patent Office 3,234,463

Patented Feb. 8, 1966

3,234,463

HIGH-FREQUENCY MEASURING APPARATUS INCLUDING SEMIMETAL THERMOELECTRIC JUNCTION MEANS

Albert Lederman and John H. Greig, New York, N.Y., assignors to MSI Electronics Inc., Richmond Hill, N.Y., a corporation of New York Filed Aug. 25, 1961, Ser. No. 134,015
5 Claims. (Cl. 324—95)

The present invention relates to high frequency power measuring apparatus, and has for an object the provision of novel apparatus that yields relatively high output in response to a given amount of input energy. Another object of this invention resides in novel high frequency measuring apparatus having high sensitivity, and exhibiting rapid response to changes in high-frequency power levels. Further objects of the invention relate to novel features of construction of thermoelectric high-frequency power measurement apparatus.

The presently preferred embodiment of the invention for achieving the foregoing objects utilizes an energy absorber in the form of a resistive film on an insulating wafer that is disposed in a waveguide, spaced from the waveguide walls. One or more thermoelectric semiconductive elements are arranged to provide the mechanical support for the energy absorber and are disposed in good heat-transfer relation therewith. Electrical connections to the thermoelectric elements are provided to make externally available the thermally generated energy due to heating thereof by the energy absorber.

The construction is such that a given level of high frequency energy to be measured causes a relatively large temperature rise of the resistive-film absorber. This is due to the fact that the mechanical support is provided by thermoelectric semiconductive elements that behave as dams in blocking the flow of heat while they serve efficiently as electrical conductors. Thermoelectric semiconductors, sometimes called "semimetals" should not be confused with metals, nor with pure silicon or germanium which are widely known as semiconductors. Thermoelectric semiconductors differ in many respects from metals, notably in that they do not obey the Wiedeman-Franz law, a law which does apply to most metals. According to this law, there is a constant ratio between the electrical conductivity and the thermal conductivity of metals. For thermoelectric semiconductors, the thermal conductivity is poor while the electrical conductivity is good. This property is usually found in intermetallic compounds between elements with high atomic weight, notably bismuth telluride and lead telluride, which are available as either N or P type thermoelectric semiconductors. Other examples of these materials are intermetallic compounds of Pb, Hg, Bi, Tl and Sb with Te, Se and S. Suitable ternary "semimetal" alloys are known, as silver antimony telluride. See "Power Generation and Heat Pumping by Thermoelectric Phenomena" by Herbert Mette, The Solid State Journal, May 1961, pages 23–30. This invention is not concerned with any novel material of this type, but with the utilization of such materials in high frequency measurement apparatus having distinctive properties and advantages.

The preferred embodiment of the invention, mentioned above, utilizes "semimetals" of both semiconductor types in series. Each generates a relatively large potential when subjected to a temperature difference, about 200 microvolts per degree centigrade in the case of bismuth telluride for each "semimetal" element. Where two such elements are electrically connected in the series-aiding sense, the output is doubled, or nearly doubled. Any number of "semimetal" thermoelectric generators may be connected electrically in series for increased output.

A known form of high frequency power measuring apparatus involves the use of thermocouples having junctions of dissimilar metals. The hot junction is applied to a high-frequency energy absorber. A difficulty inherent in such apparatus is that the electrical conductivity of the metals utilized is proportional to their thermal conductivity. This means that there is a significant transfer of heat from the hot junction along the very elements that provide the electric connection to the hot junction. Any significant conduction of heat away from the high frequency energy absorber limits the temperature rise and reduces the sensitivity of the apparatus. Further, the temperature of the nominally cold junctions tends to rise due to this heat transfer, with the result that there is a delay of the system in attaining equilibrium and a corresponding delay in making a measurement. These effects can be minimized, but various designs proposed for that purpose are inherently complicated. By using fine wire, the heat transfer is reduced; but then additional structure is needed for providing mechanical support for the resistive energy absorber. Further, the electrical output per junction is characteristically low in the case of thermocouples, usually requiring many in series, or resort to a direct-current amplifier.

An object of the present invention resides in an improved thermoelectric high frequency measurement device that minimizes the foregoing difficulties and limitations.

The nature of the invention, and further objects and novel features will be clear from the following detailed description of two embodiments, which are shown in the accompanying drawings forming part of this disclosure. In the drawings.

Figure 1:
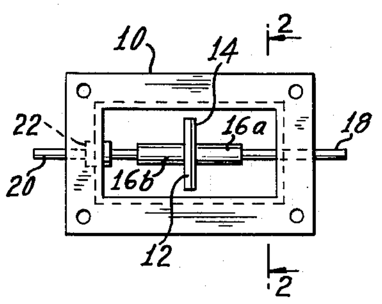
FIG. 1 is an end view of a presently preferred embodiment of the invention.
Figure 2:
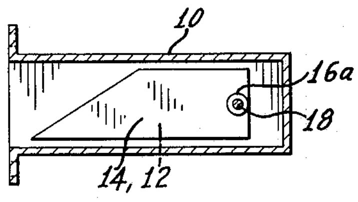
FIG. 2 is a longitudinal cross-section thereof, taken along the line 2—2 in FIG. 1.

Referring now to FIGS. 1 and 2, a flanged waveguide 10 is shown containing an energy absorber formed of a wafer 12 of insulating, heat-resistant material such as mica or Pyrex, bearing a resistive film 14 such as vapor-deposited Nichrome, with a protective film of magnesium fluoride, or a graphic film. The mica may be quite thin (0.003 inch, for example) so as to have little thermal inertia, and so that it can be easily supported mechanically.

A pair of semimetal or thermoelectric semiconductor elements **16*a* and 16*b* of opposite semiconductor types are mechanically affixed to the opposite surfaces of member 12, 14, using an electrically conductive epoxy cement, for example. As shown, elements 16*a* and 16*b* are aligned at the right-hand extremity of energy absorber 12, 14. This member may have a fine opening, through which a connection (not shown) extends from the conductive epoxy coating on one element 16 to that of the other element 16. This connection between semimetal elements 16*a* and 16*b*** which are of opposite types of semiconductivity constitutes a thermoelectric junction, and this junction is disposed at the energy-absorbing wafer.

A supporting rod 18 as of nickel is united to element **16*a* as shown, and rod 18 is joined to the waveguide wall and extends externally as a convenient terminal. Rod 20, also of nickel for example, is united to element 16*b*, and extends through an insulating bushing 22** in the waveguide wall to provide a convenient external terminal.

Waveguide 10 and energy absorber 12, 14 are arranged as a termination, member 12, 14 being tapered and designed for virtually complete absorption of the incoming energy. Being low in thermal inertia, its temperature rise per watt of absorbed energy is considerable. As indicated above, the connection of semimetal elements **16*a* and 16*b* to each other constitutes a thermoelectric junction which is in effective heat-transfer relation to absorber 12, 14. The opposite ends of semimetal elements 16*a* and 16*b* (which in use are connected to an external electrical measuring instrument, not shown) remain relatively cool due to the "heat dam" effect mentioned above. In this arrangement elements 16*a* and 16*b* constitute an efficient thermoelectric generator. However, being of the "semimetal" type as defined above, they are poor heat conductors, and thus do not greatly add to the thermal mass heated by the energy-absorbing film, which would retard the temperature rise that results in response to an increase in the incident power level. Correspondingly, the poor thermal conductivity of elements 16*a* and 16*b* conserves the heat developed in film 14 and thereby makes possible a greater temperature rise at the connection area than would prevail were there a substantial flow of heat away from that connection area along members 16*a* and 16*b***. Thus these members provide the mechanical support for the high frequency energy absorber, they act as an effective thermoelectric generator, and they constitute heat "dams" while providing external current paths for the thermoelectric energy.

Figure 3:
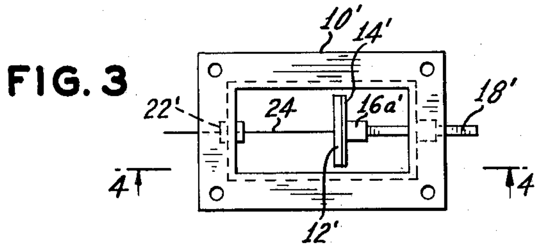
FIG. 3 is an end view of a modification.
Figure 4:
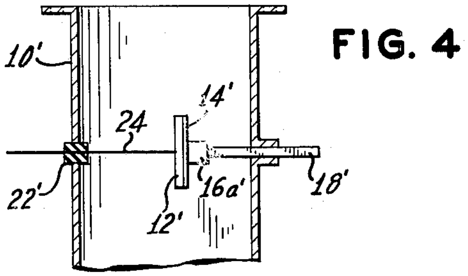
FIG. 4 is a longitudinal cross-section thereof as viewed from the line 4—4 in FIG. 3.

A modification of the foregoing is shown in FIGS. 3 and 4. In this embodiment, primed numerals are used to represent corresponding parts in FIGS. 1 and 2. Only a single thermoelectric element **16*a'* is utilized, carried by a square or other non-round supporting rod 18' that is slidable in the waveguide wall. This arrangement enables movement of energy absorber 12', 14', both near and far from the center of the guide, so as to sample any desired portion of the energy in the transmission space. In an extreme position of adjustment, the energy absorber may engage a side wall; and it is contemplated that such energy absorber may serve as a substitute for a corresponding part of the wall of the waveguide. A fine wire 24 extends to member 16*a'* through member 12', 14' and through an insulating bushing 22'. The place where wire 24 extends to member 16*a'* constitutes a thermoelectric junction which in operation is a hot junction in the measurement circuit, being heated by energy absorber 12', 14'. FIGS. 3 and 4 demonstrate the application of certain novel features of the embodiment of FIGS. 1 and 2 in another environment. Only half the sensitivity is attained. The application of FIGS. 3 and 4 does not involve a waveguide termination. Terminals 18 and 20 (FIG. 1) and 18' and 24 may be connected to a microvoltmeter (not shown) to provide direct indication of the high frequency power measurement without amplification. In FIGS. 1 and 3, elements 16*b* and 24 are of current-carrying materials that are thermoelectrically different from elements 16*a* and 16*a'***, respectively, and form thermoelectric junctions therewith.

It will be apparent that various embodiments of the invention may be devised by those skilled in the art, utilizing the novel features in the devices specifically described above. Consequently, the invention should be construed broadly, in accordance with its full spirit and scope.

What is claimed is:

1. High frequency measuring apparatus, including a waveguide, a high frequency energy absorber of relatively low thermal inertia including an electrically resistive film disposed in power absorbing relation to said waveguide but spaced from physical contact therewith, means forming a thermoelectric junction in immediate proximity to said film and in direct heat transfer relation therewith, the last mentioned means including two members of thermoelectrically different materials comprising at least one member formed of semimetal material, means extending from said two members for transmitting thermally generated electrical energy to external measuring means, and means mechanically secured to said energy absorber for supporting said energy absorber in said waveguide, said supporting means including the semimetal material of said thermoelectric junction as the only portion of the supporting means in heat-transferring proximity to said thermoelectric junction, said semimetal material constituting heat insulation interposed in said supporting means between said energy absorber and said waveguide.

2. Apparatus in accordance with claim 1, wherein said two members forming said thermoelectric junction are of semimetals of opposite types of semiconductivity.

3. Apparatus in accordance with claim 1 wherein one of said members forming said thermoelectric junction is a fine wire.

4. Apparatus in accordance with claim 1 wherein said waveguide is a rectangular waveguide, wherein said energy absorber includes a generally flat insulating wafer supporting said film, and wherein said supporting means is adjustable for supporting said wafer with adjustable spacing relative to a wall of said rectangular wageguide.

5. Apparatus in accordance with claim 1 wherein said two members extend in opposite directions away from said energy absorber and have respective supporting parts extending through opposite sides of the waveguide.

References Cited by the Examiner

UNITED STATES PATENTS

| | | | |
|---|---|---|---|
| 2,402,663 | 6/1946 | Ohl | 324—95 |
| 2,859,406 | 11/1958 | Jaffe | 324—95 |
| 3,114,104 | 12/1963 | Fleming | 324—95 |

FOREIGN PATENTS

| | | |
|---|---|---|
| 839,992 | 6/1960 | Great Britain. |

WALTER L. CARLSON, *Primary Examiner.*

R. V. ROLINEC, *Assistant Examiner.*